United States Patent [19]
Wilson et al.

[11] Patent Number: 5,512,897
[45] Date of Patent: Apr. 30, 1996

[54] VARIABLE SAMPLE RATE DAC

[75] Inventors: James Wilson, Sharon; Ronald A. Cellini, Newton; James M. Sobol, Norfolk, all of Mass.

[73] Assignee: Analog Devices, Inc., Norwood, Mass.

[21] Appl. No.: 404,235

[22] Filed: Mar. 15, 1995

[51] Int. Cl.[6] .................................................. H03M 1/66
[52] U.S. Cl. ............................ 341/144; 341/61; 341/123
[58] Field of Search ............................. 341/61, 123, 143, 341/144; 364/724.1

[56] References Cited

U.S. PATENT DOCUMENTS

| | | | |
|---|---|---|---|
| 4,179,670 | 12/1979 | Kingsbury | 331/10 |
| 4,281,318 | 7/1981 | Candy et al. | 341/61 |
| 4,797,845 | 1/1989 | Stikvoort | 364/724.1 |
| 4,953,117 | 8/1990 | Lagadec | 364/724.1 |
| 4,954,824 | 9/1990 | Yamada et al. | 341/61 |
| 4,987,373 | 1/1991 | Soo | 328/155 |
| 4,990,911 | 2/1991 | Fujita et al. | 341/123 |
| 5,075,679 | 12/1991 | Gazsi | 341/143 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,157,395 | 10/1992 | Del Signore et al. | 341/143 |
| 5,159,339 | 10/1992 | Fujita | 341/61 |
| 5,204,827 | 4/1993 | Fujita et al. | 364/724.1 |
| 5,227,787 | 7/1993 | Kurashina | 341/61 |
| 5,313,205 | 5/1994 | Wilson | 341/144 |
| 5,353,026 | 10/1994 | Wilson | 341/143 |

OTHER PUBLICATIONS

J. Janssen, et al. An Audio Engineering Society Preprint Feb. 26–Mar. 1, 1994.

Richard J. Higgins, Digital Signal Processing in VLSI, Prentice Hall, Englewood Cliffs, NJ 07632, © 1990 Analog Devices Inc.

Douglas F. Elliott, et al, Fast Transforms, Algorithms, Analyses, Applications, 1982, Academic Press.

Paul J. Hurst, et al. A Programmable Clock Generator Using Noise Shaping and Its Application in a Switched–Capacitor Filter, Solid State Circuits Research Laboratory, Dept. of Electrical and Computer Engineering, University of California, Davis, 1994, IEEE Symp. on VLSI.

*Primary Examiner*—Howard L. Williams
*Attorney, Agent, or Firm*—Wolf, Greenfield & Sacks

[57] ABSTRACT

A method and apparatus for digital-to-analog conversion using sigma-delta modulation of the temporal spacing between digital samples are provided. The method and apparatus include sigma-delta modulation of the time-base such that errors produced by non-uniform sampling are frequency-shaped to a high frequency region where they are reduced by conventional filtering techniques. In one embodiment, an oversampling modulator receives digital input samples and, responsive to a noise-shaped clock signal, modulates the digital input samples to produce modulated samples at an oversampling rate. The oversampling rate preferably is equal to an oversampling ratio times a preselected input sample rate. A DAC, coupled to the modulator, converts the modulated samples to an analog signal. A modulator sample rate control circuit, coupled to the modulator, receives a frequency select signal representing the preselected input sample rate, and produces the noise-shaped clock signal for controlling operation of the modulator at the oversampling rate. The control circuit preferably includes a first sigma-delta modulator that sigma-delta modulates the frequency select signal. The oversampling modulator preferably includes a second sigma-delta modulator.

7 Claims, 5 Drawing Sheets

VARIABLE SAMPLE RATE DAC

RELATED APPLICATIONS

The present application is related to the following U.S. applications: "Analog to Digital Conversion Having Variable Sample Rate", filed Sep. 13, 1993, Ser. No. 08/121,104; "Digital to Analog Conversion Having Variable Sample Rate", filed Sep. 13, 1993, Ser. No. 08/120,957; "Digital to Digital Sample Rate Conversion", filed May 11, 1994, Ser. No. 08/241,059; and the following International applications: "Analog to Digital Conversion Using Non-uniform Sample Rates", filed Sep. 13, 1994, Ser. No. US94/10268; "Digital to Analog Conversion Using Non-uniform Sample Rates", filed Sep. 13, 1994, Ser. No. US94/10269; and "Variable Sample Rate ADC", filed Nov. 22, 1994, Ser. No. 08/343,713. Each of the above applications is incorporated herein by reference in its entirety.

FIELD OF THE INVENTION

The present invention relates generally to the field of methods and circuits for digital-to-analog conversion. More particularly, the present invention relates to a method and circuit for digital-to-analog signal conversion using sigma-delta modulation of the temporal spacing between digital samples.

BACKGROUND OF THE INVENTION

Sigma-delta digital-to-analog converters ("DACs") and analog-to-digital converters ("ADCs") recently have come into widespread use with the development of suitable process technology and the increase in digital audio and other applications. Sigma-delta converters utilize oversampling techniques (i.e., sampling at rates greater than the Nyquist rate) to achieve high signal-to-noise ratios. Such converters also exhibit excellent linearity. Additionally, sigma-delta converters are relatively straight-forward and inexpensive to implement due to their simplicity.

Sigma-delta DACs commonly include a front-end interpolator which receives digital input samples and increases the sampling rate (typically 64 times the input sample rate) of the digital input samples. A sigma-delta modulator receives the higher frequency input samples from the interpolator and converts the samples to a lower accuracy (typical one-bit), high frequency bit stream. Additionally, the sigma-delta modulator performs an oversampling technique referred to as "noise shaping". "Noise shaping" is a technique by which the noise spectrum of the input samples is manipulated such that a major component of the quantization noise power is shifted to a frequency range higher than the upper frequency limit of the band of interest, which is typically the signal bandwidth. The one-bit data stream output by the modulator is converted to an analog signal by a conventional DAC and subsequent filtering is performed in the analog domain to reduce the high frequency quantization noise component of the analog output signal. Sigma-delta converters are described in *Mixed-Signal Design Seminar*, published by Analog Devices, Inc., Norwood, Mass., 1991, which reference is incorporated herein by reference.

FIG. 1 is a block diagram showing a typical one-bit prior art sigma-delta DAC system. The system includes an up-sample interpolator element 12, a digital low pass filter 16, a sigma-delta modulator 20, a one-bit DAC 24 and an analog low pass filter 28. Digital input samples are received on n-bit input bus 10 and provided to up-sample element 12. The digital input samples can be any number n of bits and can have any input sample rate. For example, a typical compact disc player application includes 16-bit digital input samples having an input sample rate of 44.1 kHz. Up-sample element 12 increases the input sample rate of the digital input samples by a factor of Z, typically 64. Z is referred to as an "interpolation ratio" or "up-sampling factor". The up-sampled digital input samples are provided on n-bit bus 14 to digital low pass filter 16 which filters the up-sampled digital input samples. Filter 16 filters out images between a baseband frequency and the up-sampled sampling rate. Those skilled in the art will understand that while up-sample element 12 and low pass filter 16 are shown as separate elements, those elements typically are practically implemented with a single element interpolation filter.

The filtered digital samples are provided on n-bit bus 18 to sigma-delta modulator 20. Sigma-delta modulator 20 modulates the received digital samples at an "oversampling rate" (equal to the up-sampled rate of the digital samples) and outputs a one-bit digital stream on one-bit bus 22. While the sigma-delta modulator 20 is shown and described herein as a one-bit modulator, those skilled in the art will appreciate that modulators greater than one-bit are available and are used depending on accuracy requirements. The sigma-delta modulator 20 conventionally performs noise-shaping on the digital samples providing a one-bit output stream essentially having a low-frequency signal component and a high-frequency quantization noise component.

The one-bit data stream is provided on bus 22 to one-bit DAC 24 which conventionally converts the data stream into an analog output signal on line 26. The analog output signal is provided on line 26 to low pass filter 28 which conventionally reduces the high frequency quantization noise component of the signal. As will be understood by those skilled in the art, low pass filter 28 does not actually eliminate the quantization noise, but simply reduces it to acceptable levels to suit a particular application (i.e., so that the signal can subsequently be handled by other components such as loudspeakers, etc.). Complete elimination of the quantization noise is not necessary, for example, in a compact disc player application, because the quantization noise substantially resides within an inaudible frequency range, above the audible range (i.e., above 20 kHz).

A limitation of conventional DACs, including the typical sigma-delta DAC shown in FIG. 1, is that they determine the magnitude of the input samples only at equally spaced temporal intervals. Such a process is known as uniform sampling. Additionally, with conventional DACs, the digital input sample rate is not made independent of the master clock signal used for clocking the sigma delta modulator. The input sample rate must be some integer division of the master clock signal. Consequently, if an application requires two different digital input sample rates, at least one of which is not divisible into the master clock signal, for example, then two master clock signals (having different frequencies) are required for clocking the sigma-delta modulator.

Accordingly, a general object of the present invention is to provide a method and apparatus for performing digital-to-analog conversion using non-uniform sampling (i.e., variable temporal spacing of the sampling points, independent of the master clock signal).

SUMMARY OF THE INVENTION

The present invention provides a method and apparatus for digital-to-analog conversion using non-uniform sampling. In an embodiment of the invention, the apparatus includes a DAC system including an oversampling modulator that receives digital input samples and, responsive to a noise-shaped clock signal, modulates the digital input samples to produce modulated samples at an oversampling rate. The oversampling rate is equal to an oversampling ratio times a preselected input sample rate. A DAC, coupled to the modulator, converts the modulated samples to an analog signal. A modulator sample rate control circuit, coupled to the modulator, receives a frequency select signal representing the preselected input sample rate and produces the noise-shaped clock signal for controlling operation of the modulator at the oversampling rate. The control circuit includes a first sigma-delta modulator that sigma-delta modulates the frequency select signal.

In the preferred embodiment of the present invention, the oversampling modulator includes a second sigma-delta modulator.

Also in the preferred embodiment of the present invention, the control circuit includes a frequency select circuit, coupled to the first sigma-delta modulator, that receives the preselected input sample rate as an input signal, and produces the frequency select signal for provision to the first sigma-delta modulator.

In one embodiment, the frequency select circuit includes a memory element that stores a plurality of frequency select signals and corresponding input sample rates, and a decoder, coupled to the memory element, that receives a preselected input sample rate and selects a corresponding frequency select signal for provision to the first sigma-delta modulator.

Preferably, the control circuit also includes a randomizer/suppressor circuit, coupled between the first sigma-delta modulator and the second sigma-delta modulator, that receives an input clock signal and adjusts the frequency of the clock signal based on the output of the first sigma-delta modulator to produce a noise-shaped clock for controlling the oversampling rate of the second sigma-delta modulator. The control circuit also preferably includes a frequency divider, coupled between the randomizer/suppressor circuit and the second sigma-delta modulator, that further adjusts the frequency of the noise-shaped clock.

Preferably, the input clock signal includes a master clock signal.

Another aspect of the present invention includes a method for converting digital input samples, at a preselected input sample rate, to an analog signal. The method includes the steps of computing a frequency select signal from a preselected input sample rate; producing, from the frequency select signal, a noise-shaped clock signal; modulating the digital input samples at an oversampling rate equal to the frequency of the noise-shaped clock signal; and converting the modulated samples to an analog signal.

In the preferred embodiment of the present invention, the step of producing includes the step of sigma-delta modulating the frequency select signal. The step of producing also includes the step of adjusting the frequency of an input clock signal based on the sigma-delta modulated frequency select signal.

The features and advantages of the present invention will be more readily understood and apparent from the following detailed description of the invention, which should be read in conjunction with the accompanying drawings, and from the claims which are appended to the end of the detailed description.

DETAILED DESCRIPTION

For purposes of illustration only, and not to limit the scope of the present invention, the invention will be explained with reference to specific sample rates, oversampling ratios and clock frequencies of operation. One skilled in the art will recognize that the present invention is not limited to the specific examples disclosed and can be more generally applied to other circuits and methods having different operating parameters than those disclosed.

Figure 1:
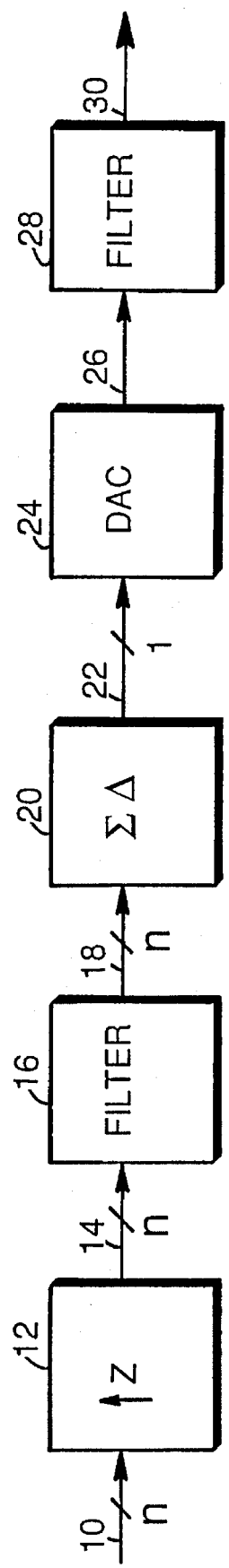
FIG. 1 is a block diagram of a conventional sigma-delta DAC system.
Figure 2:
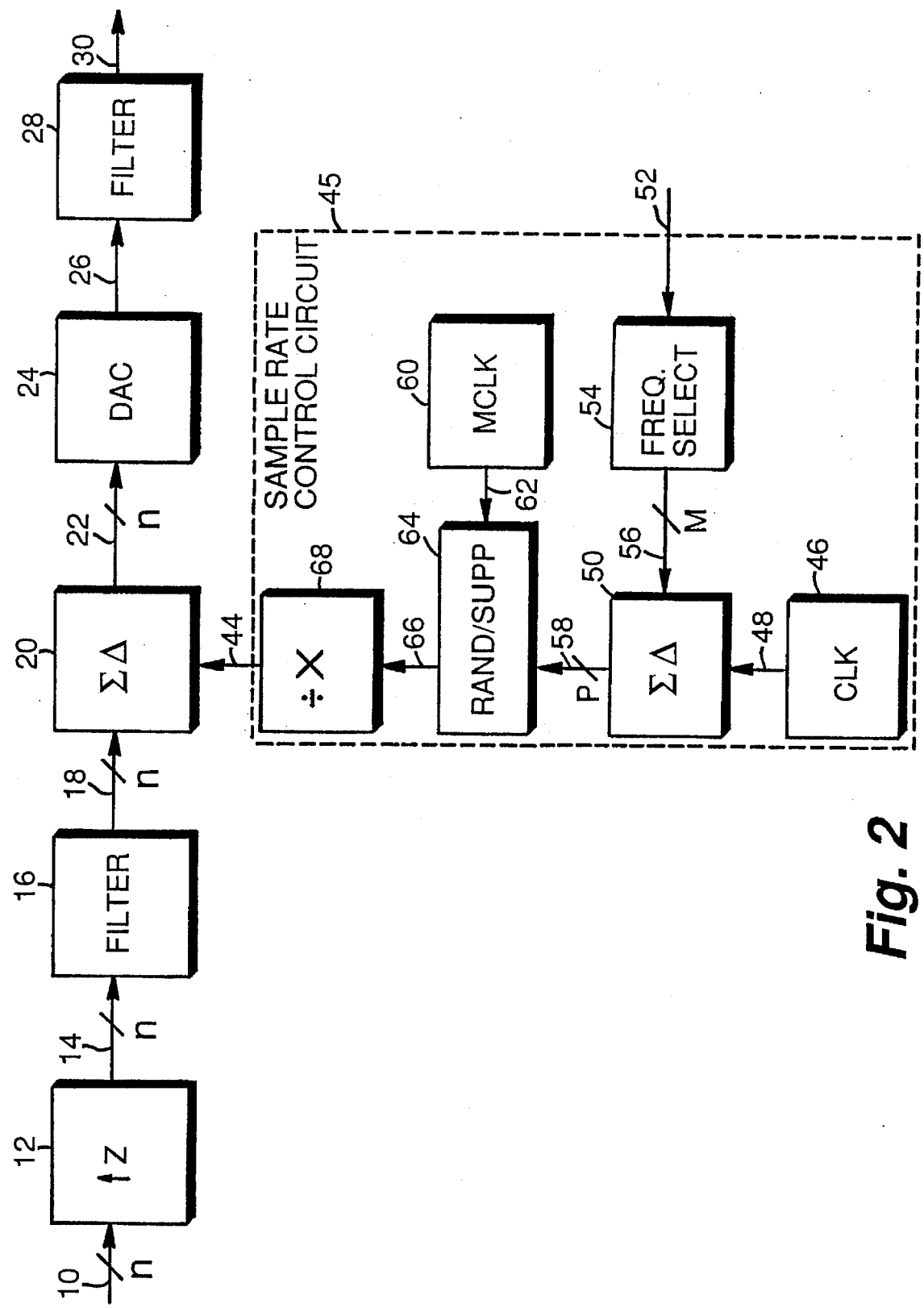
FIG. 2 is a block diagram of a general DAC system according to the present invention.

FIG. 2 is a block diagram broadly illustrating one embodiment of the present invention. The invention includes a DAC system including an up-sample element 12 receiving digital input samples on n-bit bus 10 at an input sample rate. Up-sample element 12 conventionally up-samples the digital input samples by the interpolation ratio Z and provides the up-sampled samples on n-bit bus 14 to filter 16. Digital filter 16 conventionally reduces images of the up-sampled digital samples and provides the filtered up-sampled samples on n-bit bus 18 to sigma-delta modulator 20.

Sigma-delta modulator 20 conventionally performs noise shaping on the up-sampled filtered samples at an oversampling rate controlled by a noise-shaped clock signal received on line 44. The sigma-delta modulator 20 is an n-bit modulator that provides a modulated data stream on n-bit bus 22 to DAC 24 which converts the modulated data stream to an analog signal. The analog signal is provided on line 26 to analog low pass filter 28 which reduces the high frequency quantization noise component of the analog signal and provides an analog output signal on line 30.

The overall purpose of the circuit is to produce digital input samples on bus 22 at an oversampling rate equal to an oversampling ratio times a preselected input sample rate, which may be any rate within a certain range. The preselected input sample rate is input on line 52 to the sample rate control circuit 45 which, in response, computes a clock signal and provides that clock signal on line 44 to control the sample rate of modulator 20. Because the sample rate of the modulator 20 is proportional to the oversampling ratio of the system, the sample rate control circuit 45 controls, at least in part, the oversampling ratio, as will be described in greater detail below. The fixed interpolation ratio Z of up-sample element 12 preferably is equal to the oversampling ratio. The preselected input sample rate can be any frequency value within a certain range, and can be independent of the frequency of a master clock signal of the system.

From a user-inputted desired input sample rate received on line 52, sample rate control circuit 45 produces a clock signal on line 44 which has a sigma-delta noise-shaped characteristic. Frequency select circuit 54 produces, from the desired output sample rate input signal, an M-bit digital frequency select signal representing the desired input sample rate. Digital sigma-delta modulator 50 receives the frequency select signal on bus 56 and sigma-delta modulates the frequency select signal to produce a P-bit output code on bus 58. Sigma-delta modulator 50 operates at a constant rate controlled by clock 46. A clock signal produced by clock 46 is provided to sigma-delta modulator 50 on line 48.

Randomizer/suppressor circuit 64 receives a master clock signal as an input on line 62 from master clock circuit 60 and, by control of the P-bit output code of sigma-delta modulator 50, allows a certain number of master clock signals within a set number of such signals to be outputted on line 66. In other words, a clock signal equal to a fraction (from 0 to 1) of the master clock signal will be outputted by the randomizer/suppressor circuit, the fraction depending on the P-bit code outputted by the sigma-delta modulator. The randomizer/suppressor circuit can be any one of such circuits well-known in the art. One example of such a circuit is described in *Phase Lock Loops, Theory, Design, and Applications* by Roland E. Best, published by McGraw-Hill Book Company, 1984. The clock signal outputted on line 66 has a sigma-delta noise-shaped characteristic due to the control of the sigma-delta code output on bus 58.

The noise-shaped clock signal on line 66 then can be frequency-adjusted by frequency divider 68 and provided on line 44 to control the rate of operation of modulator 20. Frequency divider 68 reduces the frequency of the noise-shaped output signal received on line 66 by a constant factor of X. Divider 68 may be implemented with a counter, as will be understood by those skilled in the art. This factor X is selected to achieve a desired oversampling ratio of the DAC system. The frequency of the clock signal on line 66 is related to the preselected sample rate inputted on line 52 and the master clock signal produced by master clock 60, which is known. Thus, the ratio of the clock signal produced on line 66 to the preselected input sample rate is known and thereby factor X of divider 68 can be preselected to achieve a desired oversampling ratio to suit a particular application.

An example of the operation of the DAC system follows. Assume that the clock signal produced on line 48 by clock 46 is 3.072 MHZ. Therefore, sigma-delta modulator 50 operates at 3.072 MHz. Additionally, assume that the master clock signal received on line 62 from master clock 60 is 24.576 MHz. If the desired input sample rate of the digital input samples received on bus 10 is 48 kHz, then a user would enter 48 kHz on line 52. Frequency select circuit 54 would produce, based on the 48 kHz input signal, an M-bit frequency select signal on line 56 representing the desired input data rate of 48 kHz. It should be understood that the number of bits M in the frequency select signal controls the precision with which the DAC system can achieve the desired input sample rate.

The frequency select signal is sigma-delta modulated by sigma-delta modulator 50 at the rate of 3.072 MHz and a P-bit output code is provided on bus 58. The P-bit output code of sigma-delta modulator 50 has a sigma-delta noise-shaped characteristic and controls randomizer/suppressor circuit 64 to adjust the frequency of the 24.576 MHz master clock signal received on line 62. Specifically, the output code of the sigma-delta modulator 50 controls the randomizer/suppressor circuit 54 to pass a fraction of the master clock signal. In this particular example, with a desired input sample rate of 48 kHz, preferably 6 out of 8 master clock signals are outputted to line 66. In other words, ¾ of the 24.576 MHz master clock signal, or an 18.432 MHz clock signal, is provided on line 66. This 18.432 MHz clock signal has a noise-shaped frequency characteristic and is approximately equal (depending on the resolution of the system) to 384 times the desired input sample rate of 48 kHz.

The 18.432 MHz clock signal can then be frequency adjusted by divider 68 to adjust the oversampling ratio of the DAC. If an oversampling ratio of 384 is desired, then further division by divider 68 is not necessary and a factor X of 1 is used. If, alternatively, an oversampling ratio of 64 is desired, then the factor X is set to 6 and the 18.432 clock signal is divided by a factor of 6 by divider 68 and the resulting 3.072 MHz clock signal is provided on line 44 to control the rate of operation of the modulator. It is noted that the 3.072 MHz signal is 64 times the desired input rate of 48 kHz (i.e., an oversampling ratio of 64). Thus, in this example, the interpolation ratio Z of up-sample element 12 would be set to 64 to produce input samples on bus 18 at the desired input sample rate of 64 times 48 kHz.

As will be appreciated by those skilled in the art, the oversampling ratio of the DAC system, set in part by factor X of divider 68, is proportional to the signal-to-noise ratio of the DAC system. A higher oversampling ratio produces a higher signal-to-noise ratio and a more accurate output. A higher oversampling ratio, however, requires a larger interpolation ratio which necessitates longer filters that are more difficult and expensive to accurately implement. Consequently, as will be understood by those skilled in the art, a balance must be struck between the desire for a higher oversampling ratio and the practical limitations on large digital filters.

Sigma-delta modulator 50 preferably is an N-th order, P-bit modulator. A higher order sigma-delta modulator will typically produce output samples with greater noise-shaped characteristics (i.e., a higher signal-to-noise ratio). The sigma-delta modulator is chosen to produce a P-bit output code (where $P \geq 1$ in a preferred embodiment) because, as the number of bits in the output code is increased, the clock rate necessary to operate the sigma-delta modulator 50 is reduced. It is to be appreciated, however, that the invention is not so limited. Sigma-delta modulator 50 could alternatively be a 1-bit modulator if the clock frequency received on line 48 and used to clock the modulator is appropriately increased.

A key feature of the present invention is that the temporal spacing of the sampling points is controlled by the N-th order, P-bit sigma-delta modulator such that any errors (i.e., noise on the sampling points) produced by the non-uniform sampling are shaped ("noise-shaped") to a high frequency range. As is well-known in the field of sigma-delta systems, the shaped noise errors can be reduced by conventional filtering techniques.

Several other advantages also are obtained. By appropriate choice of the rate at which the sigma-delta spaced sampling points are generated, and the number of bits used in controlling the spacing of those sampling points, the signal-to-noise ratio of the system can be controlled. Additionally, the degree of filtering used on the analog output signal on line 26 can also be varied to adjust the signal-to-noise ratio to suit a particular application.

Figure 3:
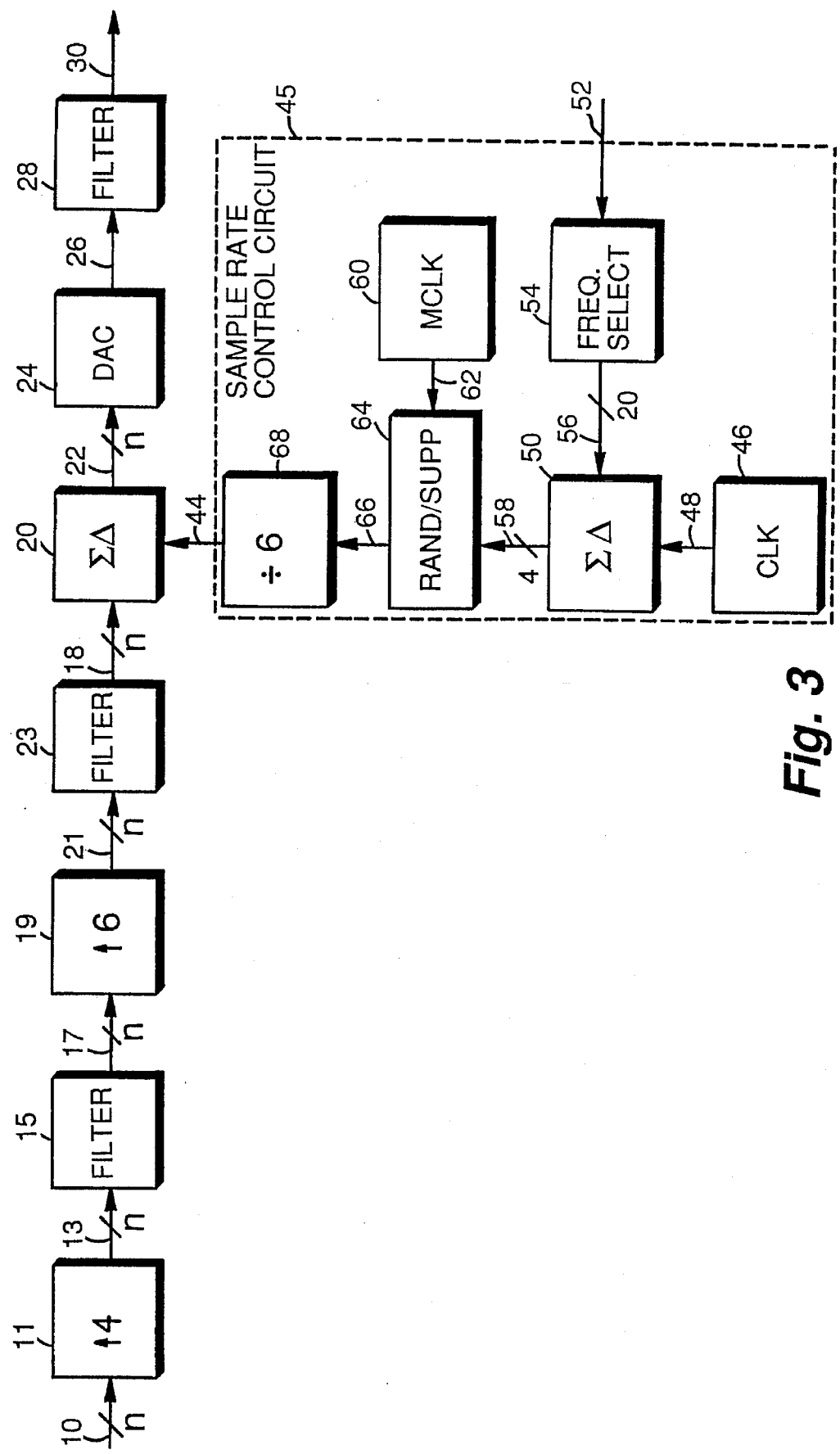
FIG. 3 is a more detailed block diagram of a sigma-delta DAC system according to a preferred embodiment of the present invention.

FIG. 3 shows, in block diagram form, the preferred embodiment of the DAC system of the present invention. The oversampling ratio of the system preferably is equal to 64. In the DAC system of FIG. 3, digital input samples are received on n-bit bus 10 and are up-sampled by a factor of 4 by up-sample element 11. The up-sampled digital samples are provided on n-bit bus 13 to digital filter 15 which reduces interpolated images and provides the digital samples on n-bit bus 17 to up-sample element 19. Up-sample element 19 further up-samples the digital samples by a factor of 16 and provides the up-sampled samples on n-bit bus 21 to digital filter 23. Digital filter 23 further reduces unwanted interpolated images of the up-sampled samples and provides the filtered samples on n-bit bus 18 to sigma-delta modulator 20.

Sigma-delta modulator 20 performs noise shaping on the received digital samples at an oversampling rate controlled by the noise-shaped clock signal received on line 44. The noise-shaped samples are provided on n-bit bus 22 to DAC 24 which converts the samples to an analog signal. The analog signal is provided on line 26 to analog low pass filter 28 which reduces high frequency quantization noise components of the signal and provides an output signal on line 30.

The digital data streams on buses 10, 13, 17, 21 18 and 22 are indicated as being n-bits wide in FIG. 3. n can be any number of bits and typically is chosen to produce the widest bit stream commensurate with the accuracy requirements of the particular application. Alternatively, the digital data streams may have different widths on the different buses.

In this preferred embodiment, the N-th order, P-bit sigma-delta modulator 50 is a fourth order, four-bit modulator. Modulator 50 provides a four-bit code on bus 58 that controls the randomizer/suppressor circuit 64. Sigma-delta modulator 50 preferably is clocked using a 3.072 MHz clock 46. The master clock signal on line 62 preferably is 24.576 MHz. The frequency select signal produced by frequency select circuit 54 on line 56 preferably is a 20-bit number. The frequency select number ranges from $-2^{19}$ to $+2^{19}$. This 20-bit number controls the precision with which the four-bit number output by the sigma-delta modulator 68 represents the desired input sample rate. Sigma-delta modulator 50 modulates the 20-bit frequency select number to produce sigma-delta modulated four-bit codes on bus 58 that control the randomizer/suppressor circuit 64. The first bit of the four-bit code is a sign bit. The remaining three bits control the randomizer/suppressor circuit, as described above.

Table 1 (below) illustrates the relationship among the four-bit output codes produced by the sigma-delta modulator 50, the fraction of master clock signals passed by the randomizer/suppressor circuit 64, and the desired input sample rates when modulator 58 is clocked with a 3.072 MHz clock and the master clock input signal to the randomizer/suppressor circuit 64 is 24.576 MHz.

TABLE 1

| 4 BIT CODE | NUMBER OF CLOCK SIGNALS PASSED OUT OF 8 | DESIRED INPUT SAMPLE RATE (kHz) |
|---|---|---|
| +4 | 8 | 64 |
| +3 | 7 | 56 |
| +2 | 6 | 48 |
| +1 | 5 | 40 |
| 0 | 4 | 32 |
| -1 | 3 | 24 |
| -2 | 2 | 16 |
| -3 | 1 | 8 |
| -4 | 0 | DC |

The following examples should illustrate the operation of the sigma-delta system. Assume, for purposes of illustration, that the sigma-delta modulator 50 is clocked at 3.072 MHz. Assume also that the master clock signal is 24.576 MHz. If the desired input sample rate of 48 kHz is entered by a user on line 52, then a corresponding frequency select number will be produced by frequency select circuit 54 and modulated by the fourth order, four-bit sigma-delta modulator 50. The four-bit code generated by modulator 50 will be, on average, a +2 code, although other four-bit codes will be produced but with a lower frequency of occurrence. The time-base (i.e., the temporal spacing between samples) is sigma-delta modulated so that errors due to temporal displacement between sampled data points that cause noise are shaped into a high frequency range. This noise is then removed by conventional filtering techniques by analog filter 28.

As shown in Table 1, the +2 code (on average) directs randomizer/suppressor circuit 64 to allow 6/8, or ¾, of the master clock signal (at 24.576 MHz) to pass. In other words, the frequency of the master clock signal is reduced by 25% in this example. The clock signal output by randomizer/suppressor circuit 64 on line 66 is 18.432 MHz. The 18.432 MHz signal has a sigma-delta noise-shaped characteristic. The 18.432 MHz signal is approximately equal to 384 times the desired input sample rate of 48 kHz. Divider 68 reduces the frequency of the 18.432 MHz signal on line 66 by a factor of 6 to a 3.072 MHz signal on line 44. Thus, the sigma-delta modulator 20 is clocked at a rate of 3.072 MHz. The rate (3.072 MHz) of the sigma-delta modulator 20 is 64 times the desired input sample rate of the 48 kHz. Thus, the oversampling ratio, in this example, is 64. Up-sample element 11 (which up samples by 4) and up-sample element 19 (which up-samples by 16) in combination are effective to interpolate by the oversampling ratio of 64 to produce input samples on bus 18 at 64 times the desired input sample rate of 48 kHz.

As another example, assume that the desired input sample rate is 4 kHz. To produce input samples on bus 22 at a rate of 64 times the desired input sample rate of 4 kHz, the sigma-delta modulator would have to be clocked at 64 times 4 kHz, or 256 kHz. The 20-bit frequency select number produced by frequency select circuit 54, in response to an input of 4 kHz on line 52, is such that the sigma-delta modulator 50 produces, on average, an equal number of -3 and -4 four-bit codes, although other four-bit codes will be produced, but with a lower frequency of occurrence.

As shown in Table 1, the -3 code directs the randomizer/suppressor circuit 64 to maintain exactly the frequency of the master clock signal. In contrast, the -4 code directs the randomizer/suppressor circuit to reduce the frequency of the master clock signal to 0. As illustrated, the -3 code represents an input sample rate of 8 kHz and the -4 code represents an input sample rate of DC (0 Hz). Therefore, on average of many samples, the -3 and -4 four-bit codes represent an input sample rate of 4 kHz. After modulation of the digital input samples by sigma-delta modulator 20 at a rate of 256 kHz, the input sample rate of the digital samples on bus 22, on average of many samples, will be equal to 64 times 4 kHz.

As another example, to obtain an input sampling rate of between 56 kHz and 64 kHz, that input sampling rate would be entered and a frequency select number would be chosen such that the appropriate ratio of +3 and +4 four-bit codes would be outputted by sigma-delta modulator 50. Thus, as one skilled in the art will appreciate, any input sample rate within the working range of the system (0 to 64 kHz in this illustrative example) can be produced by selecting a frequency select number that causes the modulator to output the appropriate combination of four-bit codes.

Although a four-bit sigma-delta modulator has been described, the invention is not so limited. For example, a sigma-delta modulator that outputs fewer bits can be used if the modulator is clocked at a faster rate to achieve approximately the same signal-to-noise ratio. Similarly, a sigma-delta modulator that outputs a greater number of bits can be used, and the modulator then can be clocked at a lower rate. One skilled in the art will appreciate that the number of bits outputted and the clock rate at which the modulator operates are a function of the desired resolution and signal-to-noise ratio and can be selected and balanced depending upon the requirements of a particular application.

In the circuit of FIG. 3, both the magnitude and temporal spacing of the digital samples are sigma-delta encoded by modulator 20 and modulator 50, respectively. The sampling times may have jitter or time variation associated therewith due to the fact that the randomizer/suppressor circuit 64 (under control of sigma-delta modulator 50) and divider 68 produce a clock signal that may not correspond exactly to the oversampling ratio times the specified input sample rate (0 kHz to 64 kHz in the illustrated embodiment). One of the advantages of sigma-delta modulation of the time base is that the jitter or time variation of the sampling times has a sigma-delta noise-shaped characteristic, so that any errors that result from jitter noise are reduced by filtering in the analog domain.

Figure 4:
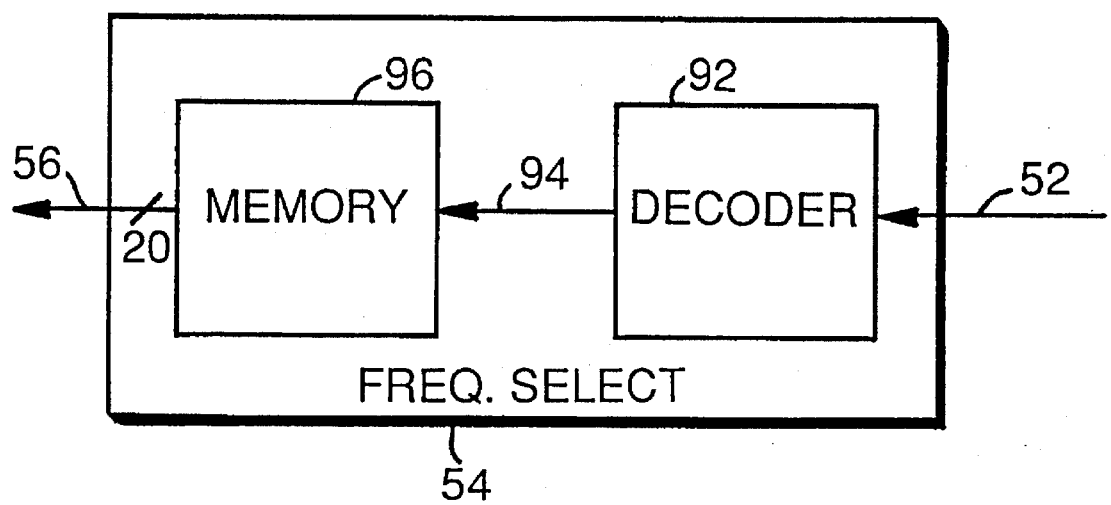
FIG. 4 is a block diagram of one embodiment of the frequency select circuit of FIG. 3.

FIG. 4 is a block diagram of one embodiment of the frequency select circuit 54. Frequency select circuit 54 receives the desired input sample rate on line 52 and produces the appropriate 20-bit frequency select number on line 56. Frequency select circuit 54 includes a memory element 96 (which may be a RAM or ROM, for example) for storing a look-up table containing the 20-bit frequency select numbers and the input sample rates to which the frequency select numbers correspond. Frequency select circuit 54 also includes a decoder 92 which, in response to the desired input sample rate inputted by a user on line 52, communicates along line 94 to select the 20-bit frequency select number from memory 96 most closely corresponding to the desired output sample rate. The 20-bit frequency select number is then inputted on 20-bit bus 56 to the sigma-delta modulator.

Alternatively, and preferably, frequency select circuit 54 produces the frequency select number by multiplying the desired input sample rate number (as inputted by a user) by a constant scaling factor.

Figure 5:
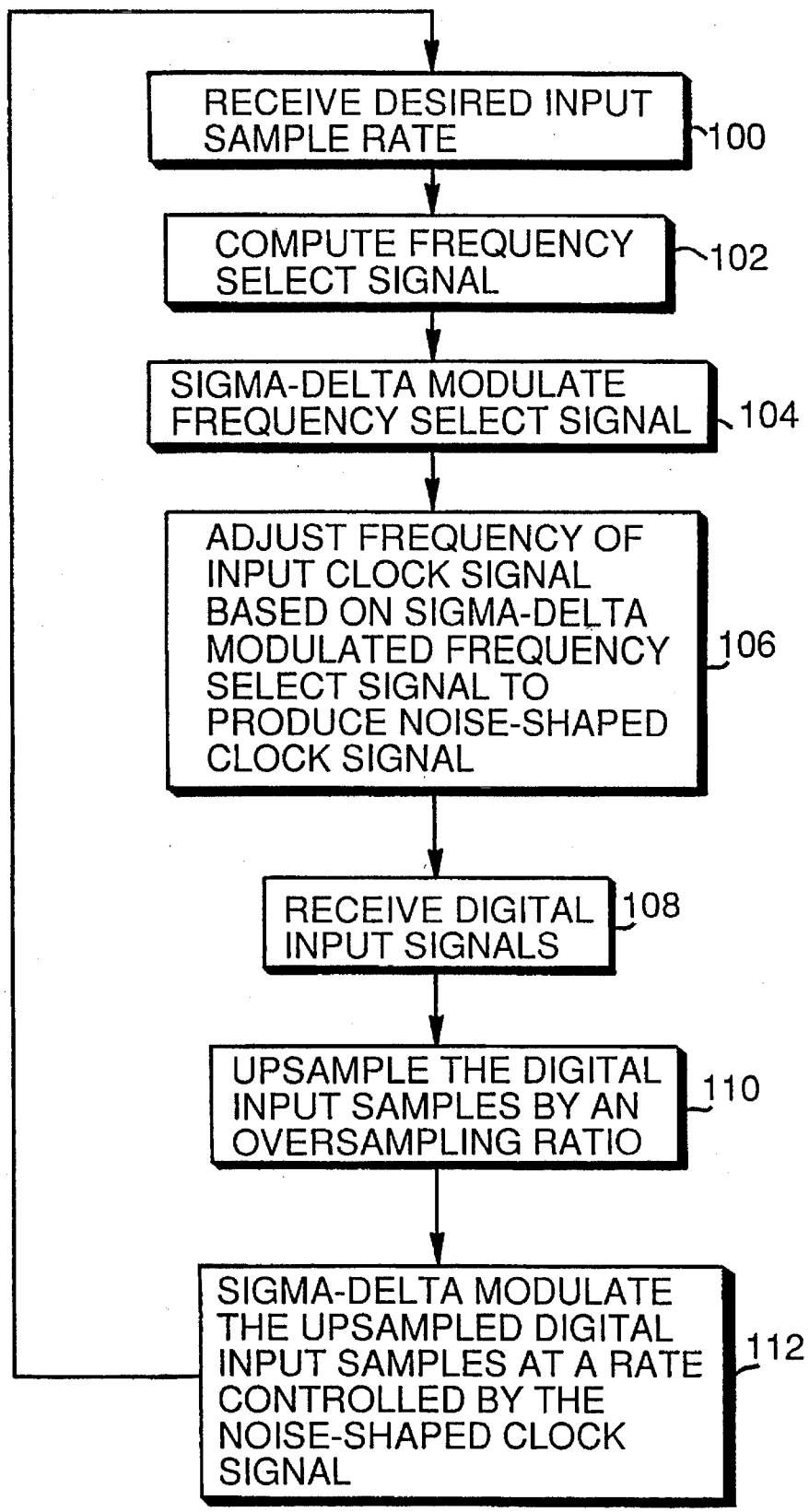
FIG. 5 is a flow chart broadly listing the steps of a method according to the present invention.

FIG. 5 is a flow chart illustrating the steps of the method of digital-to-analog conversion of the present invention. As shown in FIG. 5, the method of the present invention begins by receiving, as an input, a desired input sample rate in step 100. The method then proceeds to step 102 in which a frequency select signal is generated corresponding to the desired input sample rate. In step 104, the frequency select signal is sigma-delta modulated. Based on the output code of the sigma-delta modulator, in step 106, the frequency of an input clock signal is adjusted to produce a noise-shaped clock signal. The input clock signal can include a master clock signal. In step 108, digital input samples are received. In step 110, the digital input samples are up-sampled by an oversampling ratio. Then, in step 112, the up-sampled digital input samples are sigma-delta modulated at a rate controlled by the noise-shaped clock signal. The noise-shaped clock signal is equal to an oversampling ratio times the desired input sample rate. The steps 100–112 of this method then can be repeated.

A significant advantage of the present invention is that the sigma-delta modulator used to control the randomizer/suppressor circuit can be clocked using a fixed clock frequency, allowing optimization of the modulator operation. In addition, by outputting an appropriate combination of sigma-delta control codes, a nearly infinite number of sample rates for the input samples can be provided. These input sample rates do not need to have any integer or other rational relationship to the frequency of the master clock signal of the system. Therefore, a user can select any desired input sample rate within a working range of the system and have samples produced at that rate with a high degree of accuracy. The system requires only a single master clock and is implemented with relatively simple circuitry.

Having thus described one particular embodiment of the invention, various alterations, modifications and improvements will readily occur to those skilled in the art. For example, the present invention can be used in conjunction with any type of DAC system or digital-to-analog conversion method and is not limited to sigma-delta DAC systems. The aforementioned alterations, modifications and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A DAC system comprising:

an oversampling modulator, that receives digital input samples and, responsive to a noise-shaped clock signal, modulates the digital input samples to produce modulated samples at an oversampling rate, wherein the oversampling rate is equal to an oversampling ratio times a preselected input sample rate;

a DAC, coupled to the modulator, that converts the modulated samples to an analog signal; and a modulator sample rate control circuit, coupled to the modulator, that receives a frequency select signal representing the preselected input sample rate, and produces the noise-shaped clock signal for controlling operation of the oversampling modulator at the oversampling rate, the control circuit including a first sigma-delta modulator that sigma-delta modulates the frequency select signal.

2. A DAC system as claimed in claim 1 wherein the oversampling modulator includes a second sigma-delta modulator.

3. A DAC system as claimed in claim 1 wherein the control circuit includes a frequency select circuit, coupled to the first sigma-delta modulator, that receives the preselected input sample rate as an input signal, and produces the frequency select signal for provision to the first sigma-delta modulator.

4. A DAC system as claimed in claim 3 wherein the frequency select circuit also includes a memory element that stores a plurality of frequency select signals and corresponding input sample rates, and a decoder, coupled to the memory element, that receives the preselected input sample rate and selects a corresponding frequency select signal for provision to the first sigma-delta modulator.

5. A DAC system as claimed in claim 2 wherein the control circuit also includes a randomizer/suppressor circuit, coupled between the first sigma-delta modulator and the second sigma-delta modulator, that receives an input clock signal and adjusts the frequency of the input clock signal based on the output of the first sigma-delta modulator to produce the noise-shaped clock signal.

6. A DAC system as claimed in claim 5 wherein the control circuit further includes a frequency divider, coupled between the randomizer/suppressor circuit and the second sigma-delta modulator, for adjusting the frequency of the noise-shaped clock signal.

7. A DAC system as claimed in claim 5 wherein the input clock signal includes a master clock signal.

* * * * *